(12) United States Patent
Lovejoy

(10) Patent No.: US 6,437,605 B1
(45) Date of Patent: Aug. 20, 2002

(54) DYNAMIC SENSE AMPLIFIER FOR LOW-POWER APPLICATIONS

(75) Inventor: Michael L. Lovejoy, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/767,273

(22) Filed: Jan. 22, 2001

(51) Int. Cl.[7] ................................................. G11C 7/06
(52) U.S. Cl. ........................................ 327/51; 327/328
(58) Field of Search ..................... 327/51–57, 309–328; 365/189.21

(56) References Cited

U.S. PATENT DOCUMENTS 4,918,341 A * 4/1990 Galbraith et al. .............. 327/53
5,847,583 A * 12/1998 Matsubara .................... 327/51

* cited by examiner

*Primary Examiner*—Toan Tran
(74) *Attorney, Agent, or Firm*—William E. Zitelli, Esq.; Edel M. Young

(57) ABSTRACT

A sense amplifier (10) is disclosed comprising: a connecting node (12) connectable to a plurality of logic cells (13) for reading the logic states thereof; at least one output (16, 18, 20); circuitry (14) for transferring the read logic states from the connecting node (12) to the at least one output; and a circuit (50) dynamically operative to limit the voltage at the connecting node (12) substantially to a predetermined voltage. In one embodiment, the circuit (50) includes a pass transistor (46) coupled between the connecting node (12) and the transferring circuit (14) and operative to conduct the logic states read from the logic cells to the transferring circuit; and a capacitive divider circuit (54, 56) coupled to a voltage source ($V_{dd}$) for producing at a node (52) thereof the predetermined voltage as a fraction of the voltage of the source, the node (52) being coupled to the pass transistor (46) to limit the voltage at the connecting node (12) substantially to the predetermined voltage. In another embodiment, the capacitive divider circuit is dynamically operative in accordance with a duty cycle.

19 Claims, 2 Drawing Sheets

DYNAMIC SENSE AMPLIFIER FOR LOW-POWER APPLICATIONS

FIELD OF THE INVENTION

The present invention is directed to sense amplifiers, in general, and more particularly, to a dynamic sense amplifier for low-power applications.

BACKGROUND OF THE INVENTION

In general, a sense amplifier is coupled through a connecting node to a multiplicity of logic cells, like memory cells, for example, to read the logic states thereof via the connecting node and pass the read data on to processing circuitry. For a memory matrix of logic cells, there may be a sense amplifier coupled to each row of the matrix for reading out data from each memory cell of the memory row to the processing circuitry. For a large memory, there would be a proportionately large number of sense amplifiers. Keeping power consumption of these sense amplifiers low in low-power applications is of paramount importance especially in battery-powered applications where battery lifetime is an important consideration.

This logic cell read process is carried out by each sense amplifier without disturbing the logic state of each connected cell. To minimize disturbing a logic cell during a read operation, a sense amplifier generally includes a circuit to limit the voltage occurring at its connecting node. If left unchecked, the voltage at the connecting node during a read operation would rise to the level $V_{dd}$ of its power source, which is higher than a connected logic cell may withstand and remain undisturbed. In some applications, the sense amplifier includes a pass transistor at the connecting node, with the gate voltage thereof limited to a fraction of $V_{dd}$, like one-half $V_{dd}$, for example, by a voltage reference circuit.

Conventional voltage reference circuits are of the static type, like a resistance voltage divider circuit, for example, which produce a substantial DC current drain during read operations. While it is understood that resistive divider circuits can be designed to have lower static current draw, the speed of operation thereof then becomes a factor due to the resulting RC time constants. In fact, this is the primary reason why such circuits are not operated dynamically. Accordingly, the cumulative static current drain resulting from the read operations of the sense amplifiers contributes substantially to the overall power consumption of the particular circuit, which detracts from the intended low-power operation. Reducing the power dissipation of these sense amplifier voltage reference circuits would be considered a significant power savings improvement, especially useful for extending battery life in battery-powered applications.

The present invention proposes a sense amplifier which includes a dynamic voltage reference circuit especially suited for low-power applications, particularly battery-powered circuits. A dynamic sense amplifier has the attributes of being inherently high-speed as well as eliminating substantially static power dissipation. Thus, the improved voltage reference circuit not only reduces the power consumption of each sense amplifier, resulting in a substantial power savings, but retains the high-speed operation thereof.

SUMMARY OF THE INVENTION

In accordance with one aspect of the present invention, a sense amplifier comprises: a connecting node connectable to a plurality of logic cells for reading the logic states thereof; at least one output; circuitry for transferring the read logic states from the connecting node to the at least one output; and a circuit dynamically operative to limit the voltage at the connecting node substantially to a predetermined voltage.

In accordance with another aspect of the present invention, the sense amplifier includes a reactive impedance divider network operative to limit the voltage at the connecting node substantially to a predetermined voltage. In one embodiment, the reactive impedance divider network includes: a pass transistor coupled between the connecting node and the transferring circuit, and operative to conduct the logic states read from the logic cells to the transferring circuit; and a reactive impedance divider circuit coupled to a voltage source for producing at a node thereof the predetermined voltage as a fraction of the voltage of the source, the node being coupled to the pass transistor to limit the voltage at the connecting node substantially to the predetermined voltage.

In another embodiment, the reactive impedance divider circuit comprises a capacitive divider circuit coupled to the voltage source for producing at a node thereof the predetermined voltage as a fraction of the voltage of the source, the node being coupled to the gate drive of the pass transistor to limit the voltage at the connecting node substantially to the predetermined voltage. In yet another embodiment, the capacitive divider circuit is dynamically operative in charge and discharge states to produce the predetermined voltage at the node in accordance with a duty cycle of at least one clock signal.

DETAILED DESCRIPTION OF THE DRAWINGS

Figure 1:
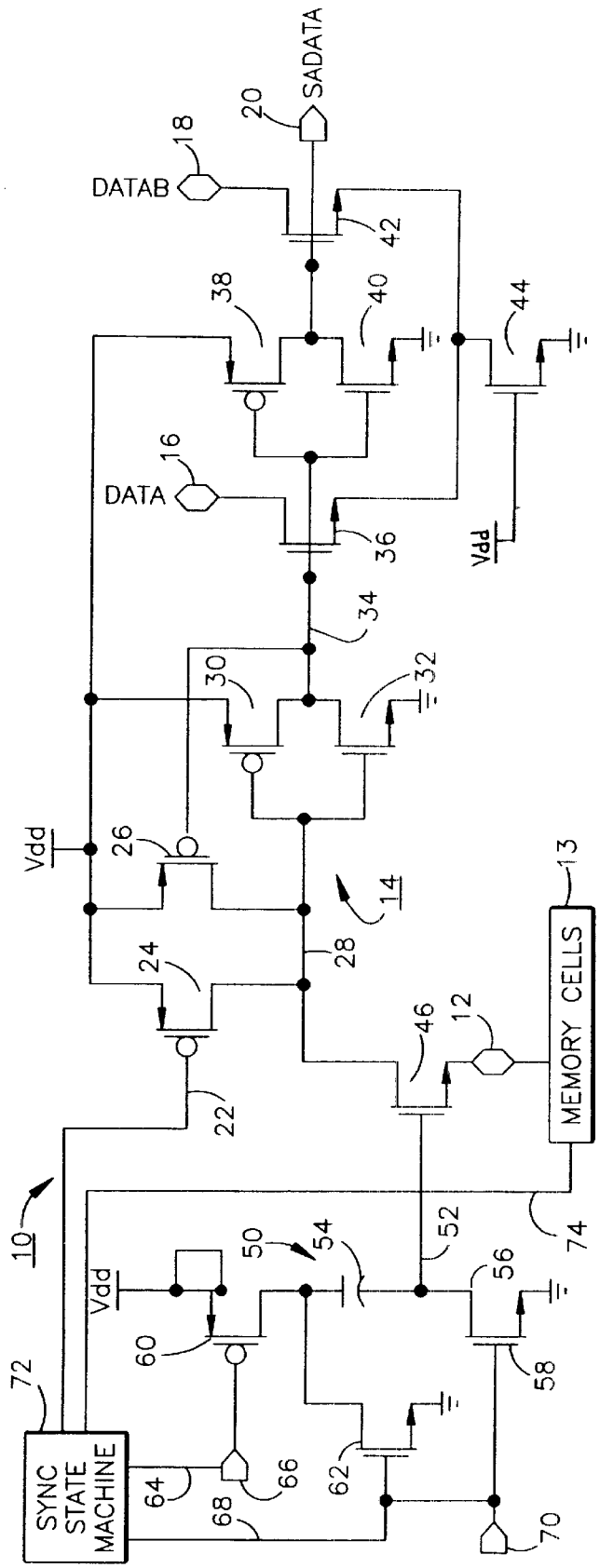
FIG. 1 is a circuit schematic of a sense amplifier suitable for embodying the principles of the present invention.

FIG. 1 is a circuit schematic of a sense amplifier suitable for embodying the principles of the present invention. Only those elements considered relevant to the present invention are being depicted in the exemplary circuit schematic. The circuit embodiment of FIG. 1 includes complementary p-type metal-oxide-semiconductor(PMOS) and n-type metal-oxide-semiconductor (NMOS) transistor bulk silicon process technology. But, it is understood that the present embodiment is merely used by way of example and that other process technologies, like bipolar and silicon-on-insulator (SOI), for example, may be used just as well without deviating from the principles of the present invention. In FIG. 1, the source region of a PMOS transistor is designated by an arrow pointing in to the channel region, and the source region of a NMOS transistor is designated by an arrow pointing out from the channel region. Also, the gate drive region of a PMOS transistor is designated by a circle, and the NMOS gate drive region has no circle. The drain regions of both the PMOS and NMOS transistors are designated by lines drawn to the other side of the channel region. In operation, when a voltage level is imposed on the gate drive region of a transistor and exceeds the gate-to-source threshold level, the transistor is considered conducting, i.e. current may flow through the channel region. Otherwise, the transistor is not conducting or essentially open-circuited.

Referring to FIG. 1, sense amplifier embodiment 10 includes a connecting node 12 that is connectable to a plurality of logic cells depicted by block 13 for reading the logic states thereof. Logic cells 13 may be memory cells of a memory matrix, which cells may be of the non-volatile type, for example. Sense amplifier 10 also includes a transferring circuit shown at 14 which comprises a plurality of complementary PMOS and NMOS transistors. Transferring circuit 14 is powered by a reference voltage source $V_{dd}$ for transferring the read logic states from connecting node 12 to at least one output. In the present embodiment, amplifier 10 includes three outputs 16, 18 and 20, referred to as data, datab (inverse of data) and sadata, respectively.

More specifically, transferring circuit 14 includes two PMOS transistors 24 and 26 coupled in parallel (source to drain) across the $V_{dd}$ source and a circuit node 28. Transistor 24 which is considered a pre-charge transistor is operative by a signal 22 applied to the gate region thereof to charge node 28 to the voltage level of $V_{dd}$, for example. Node 28 is coupled to the gate regions of a complementary pair of PMOS and NMOS transistors, 30 and 32, respectively, which are configured as an inverter. The source of transistor 30 is coupled to the $V_{dd}$ source and the source of transistor 32 is couple to a common potential which may be considered ground. The drain regions of transistors 30 and 32 are coupled together at a circuit node 34 which is coupled in a feedback arrangement to the gate region of transistor 26 to form a half-latch circuit configuration.

Node 34 is also coupled to the gate regions of an NMOS transistor 36 and PMOS and NMOS transistors, 38 and 40, respectively, which are coupled together to form another complementary pair inverter circuit powered by $V_{dd}$. The output of the inverter pair of transistors 38 and 40 is coupled to the gate region of another NMOS transistor 42 and also becomes output 20, sadata. The drain regions of transistors 36 and 42 are coupled to outputs 16, data and 18, datab, respectively. In addition, the source regions of transistors 36 and 42 are coupled to ground through another NMOS transistor 44, drain to source, with the gate region thereof coupled to $V_{dd}$. Moreover, an NMOS pass transistor 46 is coupled between connecting node 12 and circuit node 28, source to drain, and is operative to conduct the logic states read from the logic cells at connecting node 12 to node 28 of transferring circuit 14.

While the present embodiment includes circuitry to accommodate three outputs, it is understood that in some applications, a single output, such as sadata 20, for example, may be sufficient. In this case, node 34 appropriately buffered may become the single output, for example, and thus, transistors 36, 38, 40, 42 and 44 and interconnecting circuitry may be eliminated.

In operation, initially, during a read operation, node 28 is pre-charged through pre-charge transistor 24 to the voltage level $V_{dd}$ which may be on the order of 3 volts to 3.6 volts for battery powered applications. With node 28 at $V_{dd}$, node 34 is pulled down to ground level or zero volts by the inverter circuit of transistors 30 and 32 and the voltage levels of nodes 28 and 34 are latched by transistor 26 via the feedback connection, i.e. conventional half-latch operation. Also, during a read operation, pass transistor 46 is operative in the conducting state. So, if the logic state of a read cell connected to connecting node 12 is logic 0, node 28 may be discharged through pass transistor 46 and held low by the conducting cell being read at node 12. In response, node 34 is caused to charge to $V_{dd}$ via transistor 30. Also, in this state, output 16, data, is pulled low (ground) via transistor 36; output 20, sadata, is pulled low via transistor 40; and output 18, datab, is floated via non-conducting transistor 42. On the other hand, if the read cell is logic 1, node 28 will not be discharged through pass transistor 46 and outputs 16, 18 and 20 will be effected to the inverse of the aforementioned states. In this manner, the read logic states of the logic cells connected to connecting node 12 are transferred to the outputs of sense amplifier 10 by transferring circuit 14.

As described above, reading of the state of a logic cell is to be conducted without disturbing the state of the logic cell. However, if connecting node 12 is permitted to rise substantially to voltage level $V_{dd}$, for example, as would be the case if the gate drive region of pass transistor 46 was switched to $V_{dd}$ to initiate conduction thereof, it may too high a voltage level for a logic cell to withstand during a read operation and not be disturbed. In accordance with the present invention, voltage protection is being provided through use of a reactive impedance divider circuit 50 which is coupled to the gate drive region of pass transistor 46 for limiting the voltage of connecting node 12 to a predetermined voltage, preferably a fraction of the voltage $V_{dd}$. In the present embodiment, circuit 50 is coupled between the voltage source $V_{dd}$ and ground or zero volts. If the reactive elements of divider circuit 50 are of substantially equal steady-state impedance values, then a voltage of one-half $V_{dd}$ will result at a coupling node 52 thereof which is coupled to the gate drive region of pass transistor 46. During a read operation, then, pass transistor 46 is driven into conduction by the voltage at node 52 and the voltage at connecting node 12 will be limited to node 52 voltage minus the threshold voltage of transistor 46 or substantially one-half $V_{dd}$.

It is understood that the type of reactive impedance element of circuit 50 is not important to the invention so long as the DC leakage current is kept to a minimum to save on power consumption, especially for low-power applications. For example, any combination of capacitive elements may be used to provide the voltage division at node 52 thereof. Thus, once charged for a read operation, the only current drain on the $V_{dd}$ source will be the leakage current of reactive impedance divider circuit 50, which is a substantial improvement over static type voltage reference circuits conventionally used. This saving in power consumption may even be improved upon further by charging and discharging circuit 50 through a dynamic control operation at a duty cycle which may be predetermined or otherwise controlled, as will become more evident from the description found below. In this manner, many logic cells 13 may be read before having to refresh circuit 50. For example, a refresh duty cycle of 1:10, i.e. the number of cells read per a refresh period, will decrease the power consumption of the sense amplifier by an order of magnitude.

As shown by way of example in the circuit schematic of FIG. 1, reactive impedance divider circuit 50 comprises a capacitive divider circuit wherein at least one of capacitors 54 may be a polysilicon-to-metal type with an oxide dielectric, or a metal-insulator-metal type, for example, and another capacitor 56 formed in part by the PN junction of an NMOS transistor 58. The values of these capacitors may be on the order of ten to tens of femtofarads, for example.

Figure 2:
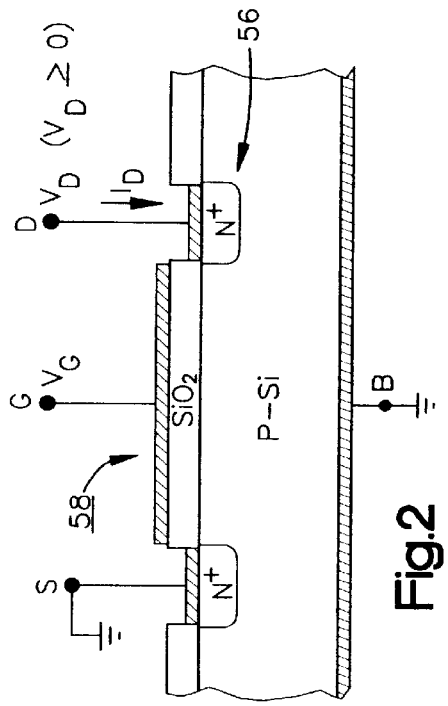
FIG. 2 is a cross-sectional view of a metal oxide semiconductor transistor having a junction for embodying a reactive element suitable for use in the embodiment of FIG. 1.

Capacitive PN junction 56 is shown in more specific detail in FIG. 2. FIG. 2 illustrates a cross-sectional view of an NMOS transistor wherein gate region G is separated from the channel region of polysilicon P—Si by a layer of silicon dioxide $SiO_2$. $N^+$ doped source S and drain D regions are provided in the polysilicon region on either side on the gate region and separated therefrom by the oxide layer $SiO_2$. Metal layers are provided over the S and D regions to effect electrical contact therewith. The circled region in the cross-sectional diagram represents the junction area of the NMOS transistor that forms the other capacitor 56 of circuit 50. The load capacitance of the GS junction of pass transistor 46 is in parallel with capacitor 56 and contributes to the capacitance thereof in the present embodiment.

Moreover, in the present embodiment, circuit 50 is dynamically operative to charge and refresh capacitors 54 and 56 of the circuit in accordance with a duty cycle governed by at least one clock signal. More specifically, a PMOS transistor 60 is coupled source-to-drain between the $V_{dd}$ source and capacitor 54 and an NMOS transistor 62 is coupled across circuit 50 to ground. The gate region of transistor 60 is connectable to one clock signal 64 via a contact 66 to control the charging of circuit 50 in accordance with a predetermined duty cycle, which may be the number of cells read per refresh cycle, for example. In addition, the gate regions of transistors 58 and 62 are connectable to another clock signal 68 via a contact 70 to control discharging of circuit 50. Clock signals 64 and 68 may be generated by a conventional synchronous state machine 72, for example. State machine 72 may also be used to generate the timing for operating pre-charge transistor 24 via signal line 22 and for addressing and reading logic cells 13 via signal lines 74.

Figure 3A:
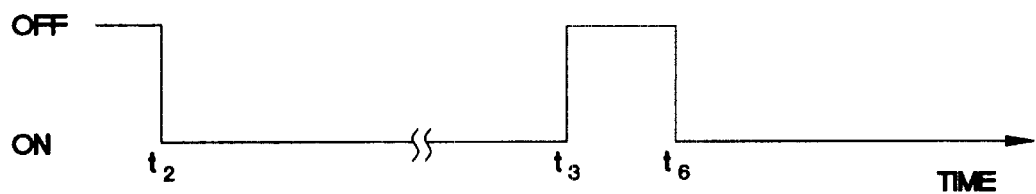
FIGS. 3A–3C are time graphs for exemplifying the dynamic operation of the embodiment of FIG. 1.
Figure 3B:
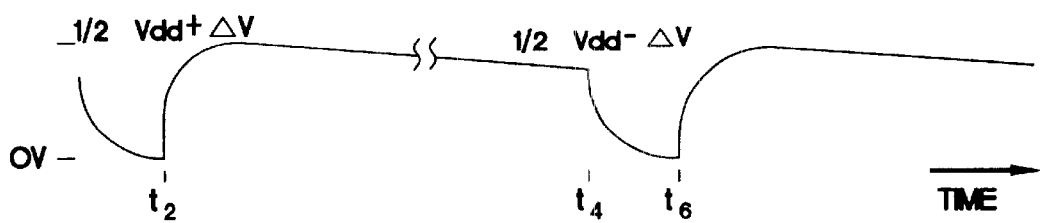
Figure 3C:
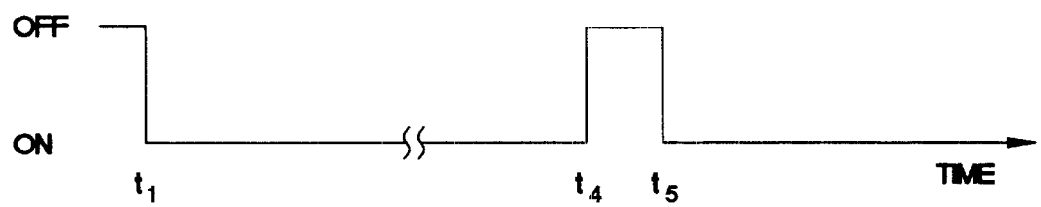

An exemplary operation of reactive impedance divider circuit 50 will now be described in connection with the time graphs of FIGS. 3A–3C. FIGS. 3A and 3C represent the operation of clock signals 64 and 68, respectively, and FIG. 3B represents the voltage levels at node 52 in response to clock signals 64 and 68. Referring to the time graphs of FIGS. 3A–3C, just before time t1, clock signal 68 was adjusted to a level to cause transistors 58 and 62 to conduct, with transistor 60 non-conductive. Consequently, capacitive divider circuit 50 is discharged to some predetermined discharge voltage, like zero volts, for example, which is exemplified in FIG. 3B. At time t1, clock signal 68 is returned to a voltage below the threshold voltage of transistors 58 and 62, rendering them non-conducting or substantially open-circuited. Thereafter, at time t2, clock signal 64 is adjusted to a voltage level beyond the threshold level of transistor 60 to cause it to conduct and charge the capacitive divider circuit from the source $V_{dd}$. In the present embodiment, the time interval t3–t2 of clock pulse 64 is made long enough to permit the capacitive circuit to charge to the intended voltage level. During this time interval, the voltage at the node 52 will rise quickly to a predetermined voltage level, which may be on the order of one-half $V_{dd}$ plus some delta voltage, for example, which is sufficient to render pass transistor 46 conducting or in a read state. Under these conditions, the voltage at connecting node 12 is limited substantially to the voltage at node 52 by the threshold voltage of pass transistor 46. Accordingly, after time t2, transistor 60 is conducting, transistor 62 is non-conducting, and the sense amplifier is in a read operation.

While sense amplifier 10 is reading and passing the states of the logic cells connected to connecting node 12 to outputs 16, 18 and 20 thereof, the voltage at node 52 is decaying due primarily to leakage currents. In the present example, the voltage at node 52 is shown decaying, but it is understood that this voltage may drift either up or down depending on whether the leakage current is out of or into node 52. At some predetermined time t3, as determined by state machine 72, which may be commensurate with the reading of N logic cells, for example, the voltage of node 52 decays to a voltage which may be on the order of one-half $V_{dd}$ minus some delta voltage, for example. At time t3, transistor 60 is rendered non-conducting, and thereafter, over a predetermined time interval t5–t4, circuit 50 is again discharged by clock signal 68. And thereafter, by rendering transistor 60 conductive, circuit 50 is refreshed at time t6. This dynamic discharge/refresh cycling of reactive impedance divider circuit 50 will be periodically controlled via clock signals 64 and 68 in accordance with the design of state machine 72. Accordingly, power consumption of the voltage reference circuit will be further reduced by this dynamic operation by a factor of 1/N, where 1:N is the duty cycle of the charging thereof.

The charging and discharging time intervals are dependent on many factors including the voltages involved, the size of the capacitors, the operating environment, the leakage currents and the like, for example. Thus, the timing of state machine 72 may take into account safe margins when predetermining the timing of the duty cycle and timing intervals. While the present embodiment has been described in connection with predetermined times, it is understood that parameters, such as voltage levels, for example, may be measured, and times determined adaptively in accordance with the voltage measurements using conventional techniques.

In summary, reactive impedance divider circuit 50 of the present embodiment reduces power consumption over functionally similar voltage reference circuits of conventional sense amplifiers to only that of the dynamic power dissipation of the reactive elements thereof during read operations. For example, if a resistive divider circuit consumes on the order of 15 milliwatts during a read operation, it is anticipated that a reactive impedance divider circuit dynamically charged will consume on the order of 0.015 milliwatts, for example, or a power consumption savings of approximately three orders of magnitude for the same read period. In addition, a further power consumption savings of 1/N may be afforded by duty cycle charging 1:N of circuit 50. If N equals ten, then an additional order of magnitude in power consumption saving may be achieved by the present embodiment.

Thus, sense amplifier 10 has the means 50 to limit voltage at the element being read while accomplishing this with purely dynamic power dissipation and essentially zero static power dissipation. Providing this voltage limiting feature is also of great importance to realizing small memory elements while preventing disturbing the memory content thereof during a read operation. Accordingly, the dynamic sense amplifier has the attribute of being inherently high-speed as well as eliminating substantially all static power dissipation.

While the present invention has been described in connection with one or more embodiments herein above, it is understood that this description is merely provided by way of example and that the invention should not be limited in any way, shape or form to such embodiments. Rather, the present invention should be construed in breadth and broad scope in accordance with the recitation of the claims appended hereto.

What is claimed is:

1. A sense amplifier comprising:
   a connecting node connectable to a plurality of logic cells for reading the logic states thereof;
   at least one output;
   circuitry for transferring said read logic states from the connecting node to said at least one output; and
   a circuit dynamically operative to limit the voltage at said connecting node substantially to a predetermined voltage.

2. The sense amplifier of claim 1 wherein the dynamically operative circuit includes a reactive impedance divider network coupled to a voltage source for producing substantially the predetermined voltage as a fraction of the voltage of said source.

3. The sense amplifier of claim 2 wherein the reactive impedance divider network is dynamically operative only during the reading of the logic states by the sense amplifier.

4. The sense amplifier of claim 2 wherein the reactive impedance divider network is dynamically operative in charge and discharge states to produce substantially the predetermined voltage in accordance with a duty cycle of at least one clock signal.

5. The sense amplifier of claim 2 wherein the dynamically operative circuit includes:

a pass transistor coupled between the connecting node and the transferring circuit and operative to conduct the logic states read from the logic cells to the transferring circuit.

6. The sense amplifier of claim 5 wherein the pass transistor includes a gate drive for controlling the conduction state of the pass transistor, said gate drive being coupled to a node of the reactive impedance divider network at which the predetermined voltage is produced, the voltage at said gate drive limiting substantially the voltage of the connecting node to which the pass transistor is coupled.

7. The sense amplifier of claim 6 wherein the reactive impedance divider network comprises a capacitive divider circuit.

8. The sense amplifier of claim 7 wherein the reactive impedance divider network includes a first transistor coupled between the capacitive divider circuit and the voltage source and operative to charge the capacitive divider circuit; and a second transistor coupled across the capacitive divider circuit and operative to discharge the capacitive divider circuit.

9. The sense amplifier of claim 7 wherein at least one of the capacitors of the capacitive divider circuit includes a junction of a transistor.

10. The sense amplifier of claim 7 wherein at least one of the capacitors of the capacitive divider circuit includes a load capacitance of the pass transistor.

11. A sense amplifier comprising:

a connecting node connectable to a plurality of logic cells for reading the logic states thereof;

at least one output;

circuitry for transferring said read logic states from the connecting node to said at least one output; and a reactive impedance divider network operative to limit the voltage at said connecting node substantially to a predetermined voltage, wherein the reactive impedance divider network is dynamically operative.

12. The sense amplifier of claim 11 wherein the reactive impedance divider network includes:

a pass transistor coupled between the connecting node and transferring circuit and operative to conduct the logic states read from the logic cells to the transferring circuit; and a reactive impedance divider circuit coupled to a voltage source for producing at a node thereof a predetermined voltage as a fraction of the voltage of said source, said node being coupled to said pass transistor to limit the voltage at said connecting node substantially to the predetermined voltage.

13. The sense amplifier of claim 11 wherein the pass transistor includes a gate drive for controlling the conduction state of the pass transistor; and wherein the node of the reactive impedance divider circuit is coupled to said gate drive.

14. The sense amplifier of claim 11 wherein the reactive impedance divider circuit comprises a capacitive divider circuit.

15. The sense amplifier of claim 14 wherein the reactive impedance divider circuit includes a first transistor coupled between the capacitive divider circuit and the voltage source and operative to charge the capacitive divider circuit; and a second transistor coupled across the capacitive divider circuit and operative to discharge the capacitive divider circuit.

16. The sense amplifier of claim 14 wherein at least one of the capacitors of the capacitive divider circuit includes a junction of a transistor.

17. The sense amplifier of claim 14 wherein at least one of the capacitors of the capacitive divider circuit includes a load capacitance of the pass transistor.

18. A sense amplifier comprising:

a connecting node connectable to a plurality of logic cells for reading the logic states thereof;

at least one output;

circuitry for transferring said read logic states from the connecting node to said at least one output;

a pass transistor coupled between the connecting node and transferring circuit and operative to conduct the logic states read from the logic cells to the transferring circuit, said pass transistor including a gate drive for controlling the conduction state of the pass transistor; and a capacitive divider circuit coupled to a voltage source for producing at a node thereof a predetermined voltage as a fraction of the voltage of said source, said node being coupled to said gate drive of the pass transistor to limit the voltage at said connecting node substantially to the predetermined voltage.

19. The sense amplifier of claim 18 wherein the capacitive divider circuit is dynamically operative in charge and discharge states to produce the predetermined voltage at the node in accordance with a duty cycle of at least one clock signal.

* * * * *